(12) United States Patent
Kang et al.

(10) Patent No.: US 8,679,964 B2
(45) Date of Patent: *Mar. 25, 2014

(54) PREVENTION AND CONTROL OF INTERMETALLIC ALLOY INCLUSIONS

(75) Inventors: Sung Kwon Kang, Chappaqua, NY (US); Da-Yuan Shih, Poughkeepsie, NY (US); Yoon-Chul Son, Daejon (KR)

(73) Assignee: International Business Machines Corporation, Armonk, NY (US)

(*) Notice: Subject to any disclaimer, the term of this patent is extended or adjusted under 35 U.S.C. 154(b) by 1160 days.

This patent is subject to a terminal disclaimer.

(21) Appl. No.: 12/173,803

(22) Filed: Jul. 15, 2008

(65) Prior Publication Data

US 2008/0293243 A1    Nov. 27, 2008

Related U.S. Application Data

(63) Continuation of application No. 11/657,000, filed on Jan. 23, 2007, which is a continuation of application No. 10/903,365, filed on Jul. 30, 2004, now abandoned.

(51) Int. Cl.
*H01L 21/44* (2006.01)

(52) U.S. Cl.
USPC ........... 438/615; 438/652; 438/660; 438/661; 257/E21.469; 257/E21.508

(58) Field of Classification Search
USPC .......... 438/615, 652, 658, 660, 661; 257/772, 257/E21.469, E21.508
See application file for complete search history.

(56) References Cited

U.S. PATENT DOCUMENTS

| | | | |
|---|---|---|---|
| 6,596,621 B1 * | 7/2003 | Copeland et al. | 438/614 |
| 6,716,738 B2 * | 4/2004 | Kim et al. | 438/612 |
| 2002/0093096 A1 | 7/2002 | Tago et al. | |
| 2003/0096494 A1 * | 5/2003 | Sakuyama et al. | 438/613 |

OTHER PUBLICATIONS

K.C. Hung, Proceedings of IEEE Electronic Component and Technology Conference, 2002, p. 1650.
O. Villalobos, Proceesings of IEEE Electronic Component and Technology Conference, 2002, p. 732.
Kim et al, J. Appl. Phys. 85, 8456 (1999).
Hung et al, J. Mater. Res. 15,2534 (2000).
Liu et al, Metall. Mater. Trans. A31A, 2857 (2000).
Zeng et al, Materials Science and Engineering, R 38, 55 (2002).
Kang et al, Proceesings 51st Electronic Component and Technology Conference, May 2001, pp. 448-454.

* cited by examiner

*Primary Examiner* — Colleen Matthews
*Assistant Examiner* — Colleen E Snow
(74) *Attorney, Agent, or Firm* — Robert J. Eichelburg; The Law Offices of Robert J. Eichelburg

(57) ABSTRACT

In using Ni(P) and Sn-rich solders in Pb free interconnections, the prevention and control of the formation of intermetallic compound inclusions, can be achieved through a reaction preventive or control layer that is positioned on top of an electroless Ni(P) metallization, such as by application of a thin layer of Sn on the Ni(P) or through the application of a thin layer of Cu on the Ni(P).

7 Claims, 5 Drawing Sheets

PREVENTION AND CONTROL OF INTERMETALLIC ALLOY INCLUSIONS

CROSS-REFERENCE TO RELATED APPLICATIONS

This application is a continuation application of application Ser. No. 11/657,000 filed Jan. 23, 2007 which is a continuation of application Ser. No. 10/903,365 Filed: Jul. 30, 2004 (now abandoned) the contents of both and each being incorporated in their entirety into this continuation application.

FIELD OF THE INVENTION

The invention is related to the fabrication of high reliability integrated circuit interconnection structures with lead free solder and in particular to the prevention of the formation of intermetallic compound inclusions that form during reflow connecting where electroless Ni(P) metallization is present.

BACKGROUND OF THE INVENTION

In integrated circuit interconnection structures, a stack of layers are assembled in which the individual metal layers provide different functions. There are situations where efforts are required to prevent unwanted interaction between layers. There is such a situation in connection with the use of lead free solder and in particular to the prevention of the formation of intermetallic compound inclusions that form during reflow connecting where electroless Ni(P) metallization is present.

Electroless nickel-phosphorus (Ni(P)) films are widely used in the microelectronic industry for several types of metallizations. They have such characteristics as excellent solderability, corrosion resistance, uniform thickness and selective deposition.

The electroless nickel phosphorous technology and its applications is well known and described in such publications as: Wiegele et al, in the Proceedings of IEEE Electronic Component and Technology Conference, 1998, p. 861; Mei et al in the Proceedings of the IEEE Electronic Component and Technology Conference, 1998, p. 952; Lin et al in the Proceedings of IEEE Electronic Component and Technology Conference, 2001, p. 455; K. C. Hung in the Proceedings of IEEE Electronic Component and Technology Conference, 2002, p. 1650; and O. Villalobos in the Proceedings of IEEE Electronic Component and Technology Conference, 2002, p. 732.

In this technology, when an Ni—P film reacts with Sn—Pb eutectic solder, a part of the film underneath the solder crystallizes into $Ni_3P$ with a (P-rich layer); that forms at about the reflow temperature of about 200-240° C. This low temperature reaction is referred to in the art as "solder reaction-assisted crystallization" and is described in a publication by Kim et al in the J. Appl. Phys 85, 8456 (1999). The "solder reaction-assisted crystallization" is different from the well known self-crystallization of Ni—P that occurs at a higher temperature.

The solder reaction-assisted crystallization is accompanied by the formation of inclusions of Ni—Sn intermetallic compounds and the formation of voids in the layer known as Kirkendall voids as described by Hung et al in the Mater. Res. publication Vol. 15, pg 2534, (2000); and by P. L. Liu et al in the Metall. Mater. Trans. publication Vol. A 31A, pg 2857, (2000).

Such interfacial reactions affect reliability and are often attributed as being the source of formation of a weak and brittle interface between Ni—P and Sn—Pb solder, as described in publications by; R Wiegele et al. in the Process of IEEE Electronic Component and Technology Conference, 1998, p. 861; by Mei et al in the Proceedings of the IEEE Electronic Component and Technology Conference, 1998, p. 9520 and by Villalobos in the Proceedings of IEEE Electronic Component and Technology Conference, 2002, p. 732.

When Sn—Pb solder is replaced by Sn-rich Pb-free solders, the reliability issue of the Ni—P interface is expected to be even more important since Pb-free solders have a higher Sn content and a higher reflow temperature as described by K. C. Hung in the Proceedings of the IEEE Electronic Component and Technology Conference, 2002, p. 1650; and by. K. Zeng et al. in Materials Science and Engineering R 38, 55 (2002).

Electroless Ni(P) is a good candidate as a reaction barrier for Pb-free, Sn-rich solders, because the intermetallic compounds forming on an electroless Ni(P) surface tend to grow more slowly than on Cu metallization during soldering.

However, severe inclusions or spalling of intermetallic compounds from Ni(P) have been reported by Kang et al in the Proceedings of the 51 st ECTC May 2001 pgs 448-454; when Pb-free solders such as pure Sn, Sn-3.5Ag, Sn-3.5Ag-3Bi (in weight %) are applied in a form of solder paste onto an electroless Ni(P) layer. Typical examples of intermetallic compounds inclusions occur where for example Sn-3.5Ag solder paste is applied on an Ni(P) layer and reflowed at 250 C for durations of between 2 min and 10 min. A further example of intermetallic compound spalling occurs when Sn solder is electroplated onto Ni(P) and the reflow condition is severe such as for 10 min reflow at 250 C or the Ni(P) is electroless Ni(P).

The delamination or spalling of intermetallic compounds at the soldering interface is a reliability risk factor in thermomechanical solder joints.

There have been earlier efforts involving such metals as Au, Ag and Pd. In those efforts a thin layer of Au on top of Ni(P) metallization did not protect the Ni(P) and therefore intermetallic compound formation or spalling was observed. In the case of an Au layer, the dissolution rate of Au into the molten Sn-rich solder, such as Sn-3.5% Ag, is expected to be so rapid that it can not protect the Ni(P) metallization. A similar situation would be expected with a thin layer of Ag or Pd on top of Ni(P) metallization.

SUMMARY OF THE INVENTION

In accordance with the invention where it is desired to control and suppress a reaction between Ni(P) and Sn-rich solders where an intermetallic compound inclusion may form adjacent to an electroless Ni(P) layer due to the P atoms that exist in Ni(P) and which would result in poor adhesion, control and suppression can be achieved through a control or protective layer on top of the electroless Ni(P) metallization such as by application of a thin layer of Sn on the Ni(P) or through the application of a thin layer of Cu on the Ni(P).

BRIEF DESCRIPTION OF THE DRAWINGS

FIGS. 1-7 are views of metallurgical samples of two adjacent layers in a stack selected to demonstrate that the formation of intermetallic compound inclusions or spalling from an electroless Ni(P) surface can be controlled or prevented by the application of a layer of Sn or Cu on the Ni(P) surface; wherein:

FIG. 1 shows intermetallic compound inclusion formation or spalling from an Ni(P) metallization, where Sn-3.5% Ag solder paste was applied on an Ni(P) layer and reflowed at 250 C for 2 min.

FIG. 2 shows intermetallic compound inclusion formation or spalling from an Ni(P) metallization, where Sn-3.5% Ag solder paste was applied on an Ni(P) layer and reflowed at 250 C for 10 min.

FIG. 3 shows an intermetallic compound inclusion that is well attached at an Ni(P) interface, having been reacted with electroplated Sn solder at 250 C for a relatively short time, such as 2 min.

FIG. 4 shows an intermetallic compound inclusion at an Ni(P) metallization interface, where electroplated Sn solder was reacted at 250 C for an extended time, such as 10 min.

FIG. 5 shows side by side samples of intermetallic compound inclusions at Ni(P) metallization interfaces each with a thin Sn layer of about 1 micron thickness, electroplated on top of an electroless Ni(P) layer, followed by being reacted with Sn-3.5% Ag solder paste at 250 C, the left one for 2 min duration and the right one for 30 min duration.

FIG. 6 shows side by side samples of intermetallic compound inclusions at Ni(P) metallization interfaces each with a thin Cu layer of about 0.4 micron thickness, electroplated on top of an electroless Ni(P) layer, followed by being reacted with Sn-3.5% Ag solder paste at 250 C, one for 2 min duration and the other for 30 min duration FIG. 7 shows side by side samples of intermetallic compound inclusions at Ni(P) metallization interfaces each with a thin Cu layer of about 0.9 micron thickness, electroplated on top of an electroless Ni(P) layer, followed by being reacted with Sn-3.5% Ag solder paste at 250 C, the left one for 2 min duration and the right one for 30 min duration

DESCRIPTION OF THE INVENTION

Figure 1:
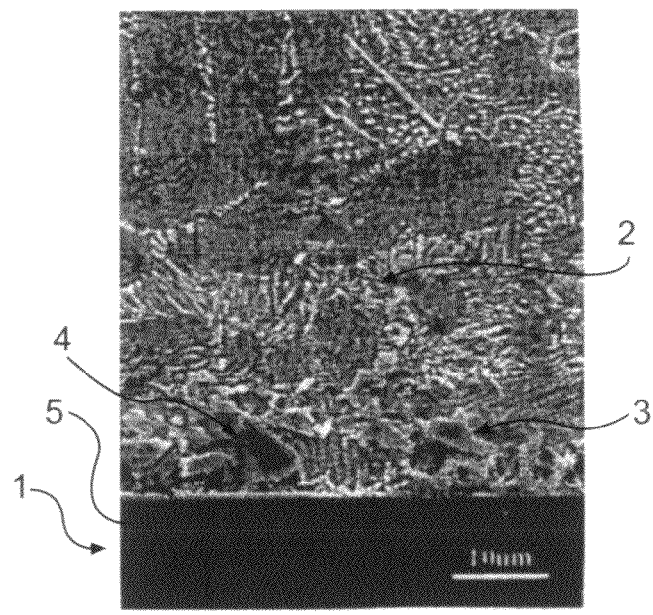

Referring to FIG. 1 there is shown a photomicrographic view of an exemplary sample of a Pb free solder joint wherein an electroless metallization 1 of Ni(P) on which a 250 um thick paste of SnAg has been subjected to a 250 degree C. reflow temperature in nitrogen gas for about 2 minutes forming a layer 2. In the layer 2, intermetallic compound inclusion formations or spalling areas, of NiSn, of which two, 3 and 4 are shown at the interface 5 with the Ni(P) metallization 1 occurs, resulting in an increase in probability of delamination at the metallization interface 5.

Figure 2:
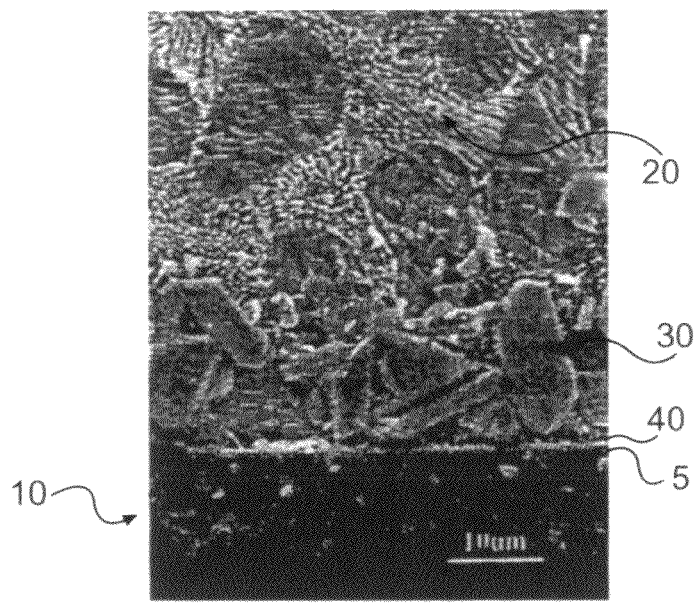

As reflow time is extended, intermetallic compound growth and separation from the interface, becomes more enhanced, as shown in FIG. 2.

Referring to FIG. 2 there is shown a photomicrographic view of an exemplary sample with an electroless metallization 10 of Ni(P) on which a 250 um thick paste 20 of SnAg has been subjected to a 250 degree C. reflow temperature for an extended duration of about 20 minutes.

It is considered that FIG. 2 is showing a Pb-free solder joint where, when the reflow time is extended, the growth of intermetallic compound inclusions 30 and a separation 40 at the metallization interface 5 become more enhanced.

The causes of the compound formations and resulting separations have been attributed to effects of poor adhesion between the P-rich layer on the Ni(P), intermetallic compound inclusions or spalling and insufficient protection of the Ni(P) layer during the reflow soldering operation.

Protection for the Ni(P) metallization can be provided through applying a protective layer directly on and over the Ni(P).

Figure 3:
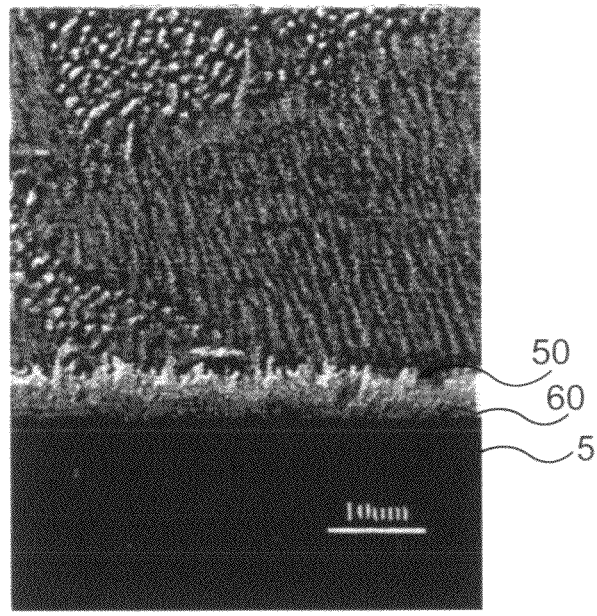

Referring to FIG. 3 where there is shown a relatively thin protective layer 50 of the invention, that is applied in a thickness range of about 0.1 micron to 5 micron and becomes well attached at the Ni(P) interface 5. The application may be achieved for example through electroplating, electroless deposition, sputtering or depositing followed by reflowing of a material such as pure Sn solder, in a quantity of about 200 micrometers thick, at a temperature of about 250 C for a relatively short time, such as 2 min. Standard application techniques such as solder paste stencil printing; solder paste screen printing, and the solder application techniques of electroplating, evaporation, sputtering and molten transfer.

The materials useable with the protective layer 50 when applied on top of Ni(P) metallization include Si-rich Pb-free solders, such as pure Sn, Sn-3.5% Ag, Sn-0.7% Cu, Sn-3% Bi, Sn-3.5%-0.7% Cu, Sn-3.5% Ag-3% Bi, Sn-8%-Zn-3% Bi, Sn-3.5% Ag-0.7% Cu-0.5% Sb; Sn 2.5% Ag-0.5% Cu; Pb bearing solders such as 63% Sn-37% Pb, 60% Sn-40% Pb, 63% Sn-37% Pb-2% Ag.

As shown in FIG. 3, a Ni—Sn intermetallic compound layer 60 forms and is well adhered at the interface 5 and no sign of inclusion formation or spalling appears.

The protective layer 50 on top of Ni(P) metallization wets well the Sn-rich solder and forms Ni—Sn or Ni—Cu—Sn intermetallic compounds that operate to protect the Ni(P).

Figure 4:
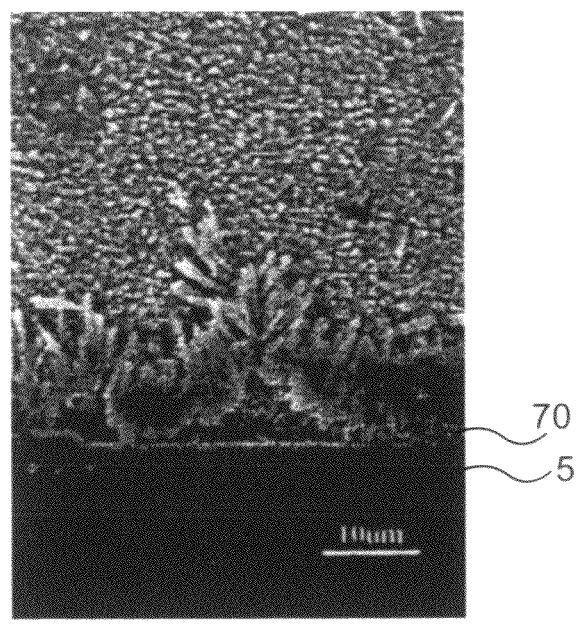

There is however a limitation in prolonged, extended reflow. As the time is extended, undesired separation progressively appears. This is illustrated in FIG. 4 where in an extended reflow of 10 min at 250 C with a pure electroplated Sn-plated sample a sign of separation is encountered, labelled 70, at the interface 5. Under such a condition, the P-rich layer, possibly as a $Ni_3P$ phase, occurring at the interface 5, would produce poor adhesion.

The effectiveness of a control or protective layer of the positioned at the interface 5 between the electroless Ni(P) layer and the metallization 1 is illustrated in connection with side by side photomicrograph views in FIGS. 5, 6 and 7.

Figure 5:
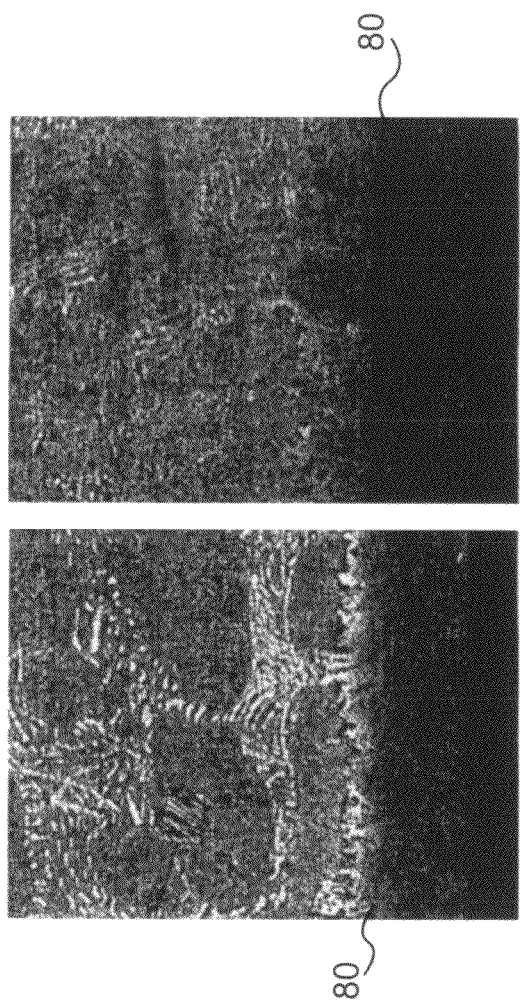

Considering FIG. 5 wherein the side by side samples each have a protective or control layer of plated Sn labelled 80 over the Ni(P) metallization of about 1 micron thickness, followed by being reacted with Sn-3.5% Ag solder paste at a temperature of 250 C. One sample was reflowed for a 2 minute duration and the other for a 30 min duration in nitrogen gas. In both cases, there is no sign of intermetallic compound inclusion formation or spalling at all. The thin layer of electroplated Sn protects the Ni(P) surface by forming a Ni—Sn layer immediately during reflow.

Figure 6:
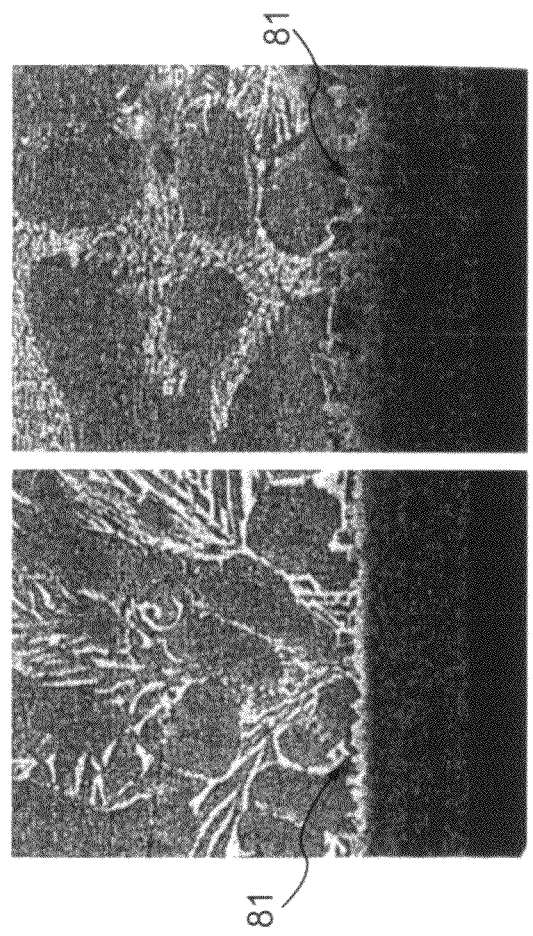

Considering FIG. 6 wherein the side by side samples each have a protective or control layer of electroless plated Cu labelled 81 over the Ni(P) metallization of about 0.4 micron thickness, followed by being reacted with Sn-3.5% Ag solder paste at a temperature of 250 C. One sample was reflowed for a 2 minute duration and the other for a 30 min duration. At both durations, there is no sign of intermetallic compound inclusion formation or spalling at all. The layer of electroplated Cu 81 protects the Ni(P) surface.

Figure 7:
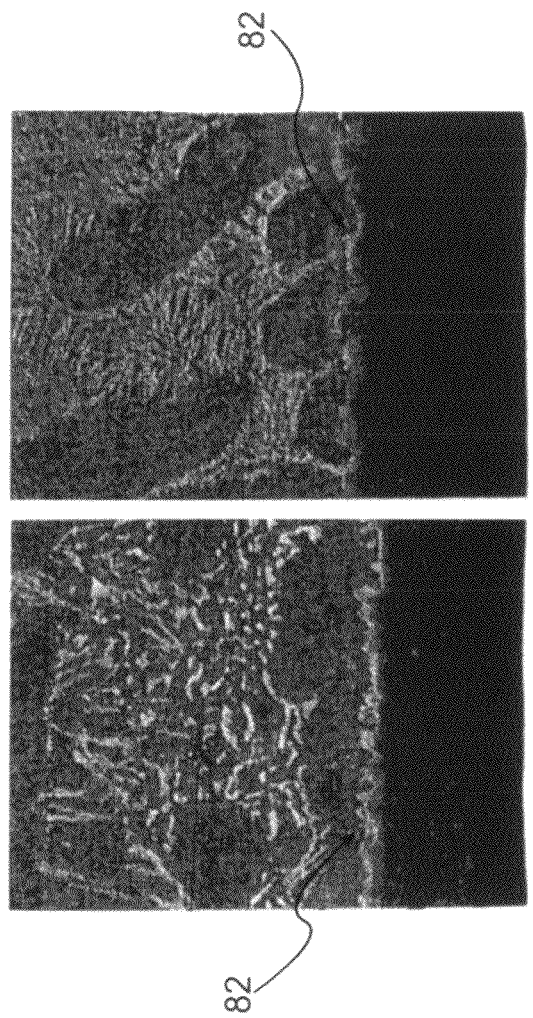

Considering FIG. 7 wherein a similar example to that of FIG. 6 is shown in which the side by side samples each have a protective or control layer of electroless plated Cu over the Ni(P) metallization that is of about 0.9 micron thickness labelled 82, followed by being reacted with Sn-3.5% Ag solder paste at a temperature of 250 C. The left sample was reflowed for a 2 minute duration and the right for a 30 min duration. At both durations there is no sign of intermetallic compound inclusion formation or spalling at all. The 0.9 micron layer of electroplated Cu protects the Ni(P) surface. An electroless Cu layer may also be deposited on top of a nickel plate layer by seeing an electroless nickel phosphor layer using Pd. The electroless process is more practical than electroplating.

What has been described is the suppression of a reaction that forms intermetallic compound inclusions between Ni(P)

and Sn-rich solders in Pb free interconnections that is achieved through a reaction preventive or control layer that is positioned on top of an electroless Ni(P) metallization, such as by application of a thin layer of Sn OD the Ni(P) or through the application of a thin layer of Cu on the Ni(P).

Thus, taking all of the foregoing into account, the invention in various embodiments comprises a process for inhibiting intermetallic inclusions in the fabrication of integrated circuit interconnection structures by providing stacked layers on the integrated circuit comprising as a first layer an electroless Ni (P) coating, and as a second layer, a metal selected from Sn or Cu, and as a third layer, a Sn rich Pb-free solder and subjecting the stacked layers to a fusion temperature excursion to fuse the stacked layers together. In a further embodiment the second layer ranges in thickness from 0.1 to 5.0 microns. Also, the temperature excursion is up through 250° C. at these thicknesses. Additionally, when the second layer ranges in thickness from 0.1 to 5.0 microns the third layer may be a material from the group Sn-0.7%Cu, Sn3%Bi, Sn3.5%-0.7%Cu, Sn-3.5%Ag-3%Bi, Sn-8%Zn-3%Bi, Sn-3.5%Ag-0.7%Cu-0.5%Sb, and Sn-2.5%Ag-0.5%Cu. The invention also comprises a product made by any of the foregoing processes.

What is claimed is:

1. A process for inhibiting intermetallic inclusions in the fabrication of integrated circuit interconnection structures, comprising providing stacked layers on said integrated circuit comprising as a first layer an electroless Ni (P) coating, and as a second layer, a metal selected from Sn or Cu, and as a third layer, a Sn rich Pb-free solder and subjecting said stacked layers to a fusion temperature excursion to fuse said stacked layers together.

2. The process of claim 1 wherein said second layer ranges in thickness from 0.1 to 5.0 microns.

3. The process of claim 1 wherein said second layer ranges in thickness from 0.1 to 5.0 microns and said temperature excursion is up through 250° C.

4. The process of claim 1 wherein said second layer ranges in thickness from 0.1 to 5.0 microns and said third layer is a material from the group Sn-0.7% Cu, Sn3% Bi, Sn3.5%-0.7% Cu, Sn-3.5% Ag-3% Bi, Sn-8% Zn-3% Bi, Sn-3.5% Ag-0.7% Cu-0.5% Sb, and Sn-2.5% Ag-0.5% Cu.

5. A product made by the process of claim 2.

6. A product made by the process of claim 3.

7. A product made by the process of claim 4.

* * * * *